United States Patent
Minamio et al.

(10) Patent No.: US 7,132,315 B2
(45) Date of Patent: Nov. 7, 2006

(54) LEADFRAME, PLASTIC-ENCAPSULATED SEMICONDUCTOR DEVICE, AND METHOD FOR FABRICATING THE SAME

(75) Inventors: Masanori Minamio, Osaka (JP); Hiroshi Horiki, Kyoto (JP); Tetsushi Nishio, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 13 days.

(21) Appl. No.: 11/154,541

(22) Filed: Jun. 17, 2005

(65) Prior Publication Data

US 2005/0236701 A1    Oct. 27, 2005

Related U.S. Application Data

(62) Division of application No. 10/689,642, filed on Oct. 22, 2003, now Pat. No. 7,042,071.

(30) Foreign Application Priority Data

Oct. 24, 2002  (JP) ............... 2002-309320
Oct. 24, 2002  (JP) ............... 2002-309324

(51) Int. Cl.
*H01L 21/50*  (2006.01)
*H01L 23/495*  (2006.01)

(52) U.S. Cl. ............ 438/123; 438/620; 438/111; 257/666; 257/670; 257/674; 257/675; 257/E23.031; 257/E23.004

(58) Field of Classification Search ........... 438/111, 438/123, 620, FOR. 377, FOR. 380; 257/666–677, 257/E23.031, E23.059, E23.004, E23.043
See application file for complete search history.

(56) References Cited

U.S. PATENT DOCUMENTS

| | | | |
|---|---|---|---|
| 4,400,714 A | | 8/1983 | Brown |
| 5,430,331 A | | 7/1995 | Hamzehdoost et al. |
| 5,491,364 A | | 2/1996 | Brandenburg et al. |
| 5,541,446 A | | 7/1996 | Kierse |
| 5,621,190 A | | 4/1997 | Yamasaki et al. |
| 5,681,777 A | * | 10/1997 | Lynch et al. ............ 29/827 |
| 5,969,411 A | | 10/1999 | Fukuya |
| 6,181,000 B1 | | 1/2001 | Ooigawa et al. |
| 6,338,984 B1 | * | 1/2002 | Minamio et al. ......... 438/123 |
| 6,399,415 B1 | * | 6/2002 | Bayan et al. ........... 438/106 |
| 6,455,356 B1 | * | 9/2002 | Glenn et al. ........... 438/123 |
| 6,627,976 B1 | | 9/2003 | Chung et al. |
| 6,777,788 B1 | | 8/2004 | Wan et al. |
| 2002/0014683 A1 | | 2/2002 | Ichinose |
| 2004/0159918 A1 | | 8/2004 | Lee |

FOREIGN PATENT DOCUMENTS

| | | |
|---|---|---|
| JP | 2000-150765 | 5/2000 |
| JP | 2001-077274 | 3/2001 |
| JP | 2002-246529 | 8/2002 |

* cited by examiner

*Primary Examiner*—Jasmine Clark
(74) *Attorney, Agent, or Firm*—McDermott Will & Emery LLP

(57) ABSTRACT

An inventive leadframe includes an outer frame, a die pad, and a plurality of leads each having land portions and connections. The land portions each have an upper surface serving as a bonding pad to be connected with a metal wiring, and a lowermost part serving as an external terminal. The connections are each devoid of its lower part so as to be thinner than the land portion, and are provided between the outer frame and the land portions, between the land portions associated with each other in each lead, and between the land portions and the die pad. Furthermore, the inventive leadframe is provided with no member that functions as a suspension lead for connecting the outer frame and the die pad to each other during plastic encapsulation.

6 Claims, 12 Drawing Sheets

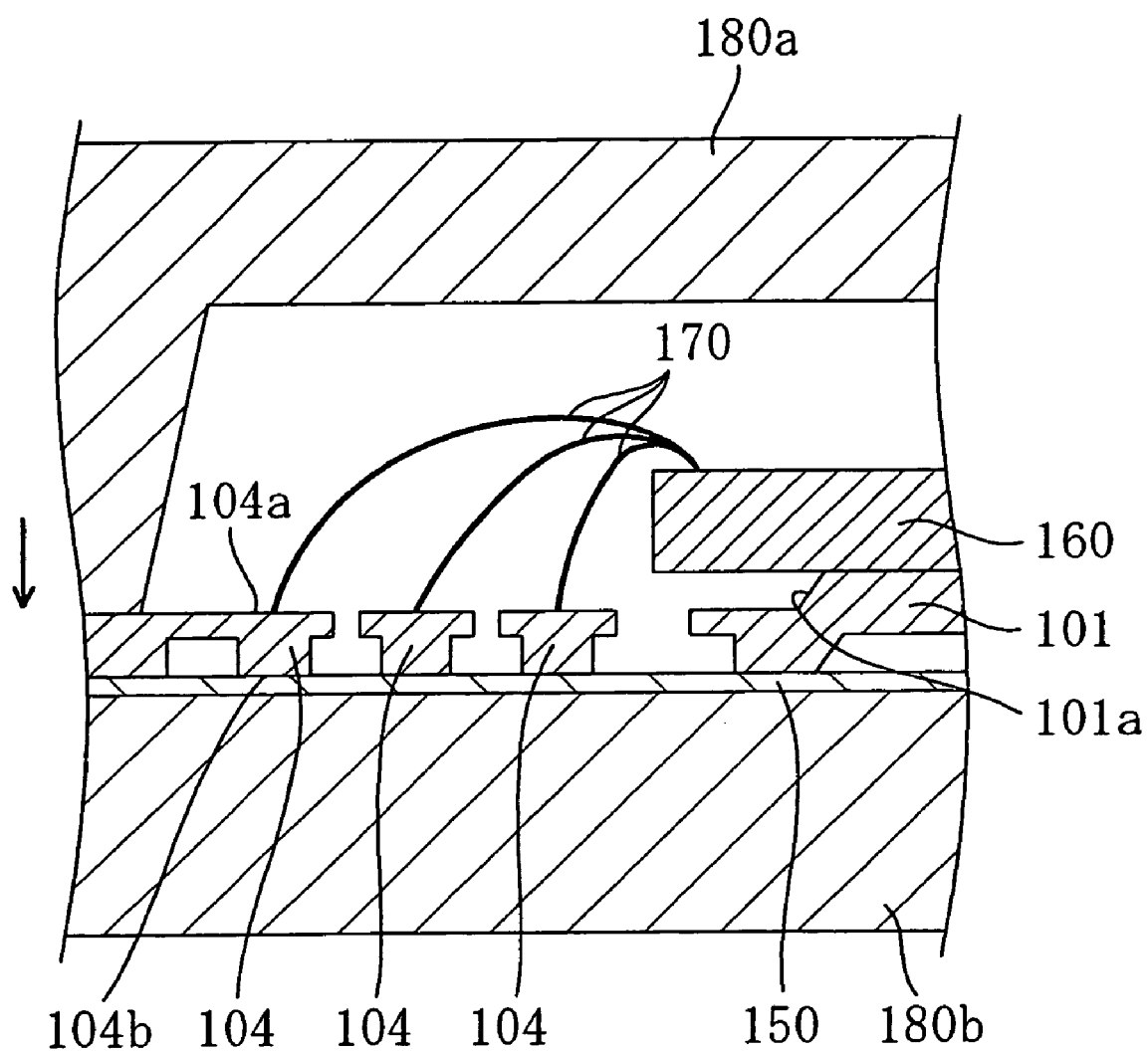

LEADFRAME, PLASTIC-ENCAPSULATED SEMICONDUCTOR DEVICE, AND METHOD FOR FABRICATING THE SAME

This application is a divisional of U.S. application Ser. No. 10/689,642 filed on Oct. 22, 2003, now U.S. Pat. No. 7,042,071.

BACKGROUND OF THE INVENTION

The present invention relates to a plastic-encapsulated semiconductor device that is plastic-encapsulated at a portion thereof in which a semiconductor chip is mounted on a leadframe, and that exposes land electrodes each serving as an external terminal at the bottom surface of the device, and also relates to a leadframe used for the plastic-encapsulated semiconductor device.

In recent years, in order to cope with the downsizing of electronic equipment, high-density packaging of semiconductor components has been more and more required. In keeping with this trend, semiconductor devices are reduced not only in size but also in thickness. Furthermore, a variety of new ideas and new devices are being tested for the reduction of production cost and the improvement of productivity. Hereinafter, a conventional leadframe used for a plastic-encapsulated semiconductor device, and how the leadframe is formed will be described.

FIG. 12 shows the structure of a conventional leadframe used for a plastic-encapsulated semiconductor device disclosed in Japanese Unexamined Patent Publication No. 2001-77274. As shown in FIG. 12, the conventional leadframe includes: a die pad 1001 on which a semiconductor chip is to be mounted; suspension leads 1003 each having a tail end which is connected to an outer frame 1002 and a front end at which an associated one of four corners of the die pad 1001 is supported; and linear land leads 1004 and leads 1005 each having a front end facing the die pad 1001 and a tail end connected to the outer frame 1002. As used herein, "suspension lead" refers to a lead that is suspended between a die pad and an outer frame of a leadframe. The bottom portions of the land leads 1004 and leads 1005 each constitute an external terminal (land portion 1008). Each lead 1005 is formed so that, in addition to the bottom portion thereof, an outer lateral portion thereof constitutes an external terminal to be connected to a motherboard. Besides, the front end of each land lead 1004 is extended beyond that of each lead 1005 and is located closer to the die pad 1001.

The die pad 1001 is provided with an upwardly protruding circular protrusion 1006 located at an approximate center of the surface of the die pad 1001. The protrusion 1006 is formed by performing a pressing process in which a plate constituting the die pad 1001 is pressed so that the plate is half-sheared and is partially protruded upward. The protrusion 1006 substantially functions as a portion for supporting a semiconductor chip, and when a semiconductor chip has been mounted thereon, a gap is formed between the top surface of the die pad 1001 (except a region thereof at which the protrusion 1006 is formed) and the bottom surface of the semiconductor chip. At a region of the top surface of the die pad 1001 surrounding the protrusion 1006, a groove 1007 is provided. When a semiconductor chip, which has been mounted on the die pad 1001, is encapsulated with plastic encapsulant, the plastic encapsulant is allowed to get into the groove 1007.

With the use of the leadframe formed as described above, a semiconductor chip is mounted on the die pad, connected to each lead with a metal wiring, and encapsulated with plastic encapsulant, thereby forming a plastic-encapsulated semiconductor device. In the resulting device, the bottom surface of each land portion 1008 whose front end is curved is located at the bottom surface of the plastic-encapsulated semiconductor device, i.e., the bottom surface of the plastic package, and the bottom portion of each lead 1005 whose front end is curved is located outwardly of each land portion 1008 so that two rows of the external terminals are arranged in a zigzag manner. Thus, a Land Grid Array (LGA) package is provided.

SUMMARY OF THE INVENTION

However, the conventional leadframe presents the following problems.

Although an LGA package in which a plurality of rows of the land portions are arranged can be obtained by using the conventional leadframe, the land portions cannot be provided at a region of the leadframe where the suspension leads 1003 for fixing the die pad 1001 exist. Therefore, restrictions are imposed when the number of the land portions (terminal electrodes) is increased.

Further, when plastic encapsulation is carried out to form a semiconductor device using the leadframe, warping of the semiconductor device occurs because the coefficients of thermal contraction of the die pad and the plastic encapsulant are different due to the existence of the suspension leads.

Furthermore, the number of process steps carried out before a sheet is affixed is increased, which contributes to an increase in the cost.

Therefore, with an eye to forming more various semiconductor devices and more numerous terminals in each semiconductor device, the object of the present invention is to provide a leadframe suitably used in fabricating a high-quality plastic-encapsulated semiconductor device with a high productivity at a low cost, a plastic-encapsulated semiconductor device formed using such a leadframe, and a method for fabricating the device.

A first inventive leadframe includes: an outer frame; a die pad; and a plurality of leads each having land portions and connections. The land portions each have an upper surface serving as a bonding pad and a lowermost part serving as an external terminal, and the connections are provided between the outer frame and the land portions, between the land portions associated with each other in each lead, and between the land portions and the die pad. In addition, in the first inventive leadframe, there exists no lead that functions as a suspension lead during plastic encapsulation.

Thus, the external terminals can be provided instead of suspension leads that have normally been provided in the corners of the die pad, and therefore, it becomes possible to obtain a plastic-encapsulated semiconductor device in which the external terminals are provided at a high density. Further, it becomes possible to suppress, for example, deformation and displacement of the die pad which are likely to occur due to the existence of the suspension leads.

In one embodiment of the first inventive leadframe, the lowermost parts of the land portions may be substantially identical in shape in plan view and may be arranged in a lattice pattern. In such an embodiment, a higher density packaging can be achieved.

In another embodiment of the first inventive leadframe, three or more rows of the lowermost parts of the land portions are preferably arranged along each side of the outer frame.

A second inventive leadframe includes: an outer frame; a die pad having a thin portion that is provided along the peripheral section of the die pad and that is devoid of its lower part, and having heat dissipating terminals protruded downward from the lower surface of the thin portion; and a plurality of leads each having land portions and connections. The land portions each have an upper surface serving as a bonding pad and a lowermost part serving as an external terminal, and the connections are provided between the outer frame and the land portions, between the land portions associated with each other in each lead, and between the land portions and the heat dissipating terminals.

Thus, when a plastic-encapsulated semiconductor device that has been formed using the leadframe is mounted on a motherboard, the external terminals and the heat dissipating terminals can be connected to, for example, electrodes of the motherboard by a ass reflow soldering process, thus carrying out the packaging more stably and easily.

In one embodiment of the second inventive leadframe, the land portions and the heat dissipating terminals may be substantially identical in shape in plan view and may be arranged in a lattice pattern. In such an embodiment, a higher density packaging can be achieved.

In another embodiment of the second inventive leadframe, the land portions and the heat dissipating terminals are preferably arranged at substantially fixed pitch intervals in at least one direction. In still another embodiment, three or more rows of the land portions are preferably arranged along each side of the outer frame.

A first inventive plastic-encapsulated semiconductor device is one that is formed using the first inventive leadframe. More specifically, the first inventive plastic-encapsulated semiconductor device includes: a die pad; a semiconductor chip; land portions each having an upper surface serving as a bonding pad to be connected with a metal wiring and a lowermost part serving as an external terminal; and a plastic encapsulant for encapsulating the semiconductor chip, land portions, die pad and so on, with the lowermost parts of the land portions and at least a part of the bottom surface of the die pad exposed, wherein the semiconductor device is provided with no member that extends from the die pad and that has its end exposed at a surface of the plastic encapsulant.

Thus, the external terminals can be provided instead of the suspension leads that have normally been provided in the corners of the die pad, and therefore, it becomes possible to obtain a plastic-encapsulated semiconductor device in which the external terminals are provided at a high density.

In one embodiment of the first inventive plastic-encapsulated semiconductor device, the external terminals may be substantially identical in shape in plan view and may be arranged in a lattice pattern at the bottom surface of the plastic encapsulant. In such an embodiment, a higher density packaging can be achieved.

In another embodiment of the first inventive plastic-encapsulated semiconductor device, three or more rows of the external terminals are preferably arranged at the bottom surface of the plastic encapsulant along the peripheral region thereof.

A second inventive plastic-encapsulated semiconductor device is one that is formed using the second inventive leadframe. More specifically, the second inventive plastic-encapsulated semiconductor device includes: a die pad having a thin portion that is provided along the peripheral section of the main body of the die pad and that is devoid of its lower part, and a plurality of heat dissipating terminals provided so as to protrude downward from the lower surface of the thin portion; a semiconductor chip; land portions each having an upper surface serving as a bonding pad to be connected with a metal wiring and a lowermost part serving as an external terminal; and a plastic encapsulant for encapsulating the semiconductor chip, land portions, leads, die pad and so on, with the lowermost parts of the land portions and the lowermost parts of the heat dissipating terminals exposed.

Thus, when the plastic-encapsulated semiconductor device is mounted on a motherboard, the external terminals and the heat dissipating terminals can be connected to, for example, electrodes of the motherboard by a mass reflow soldering process, thus carrying out the packaging more stably and easily.

In one embodiment of the second inventive plastic-encapsulated semiconductor device, the external terminals and the heat dissipating terminals may be substantially identical in shape in plan view and may be arranged in a lattice pattern at the bottom surface of the plastic encapsulant. In such an embodiment, the packaging can be carried out more easily at a high density.

In another embodiment of the second inventive plastic-encapsulated semiconductor device, the external terminals and the heat dissipating terminals are preferably arranged at substantially fixed pitch intervals in at least one direction. In still another embodiment, three or more rows of the external terminals are preferably arranged at the bottom surface of the plastic encapsulant along the peripheral region thereof.

In a first inventive method for fabricating a plastic-encapsulated semiconductor device, after the first inventive leadframe has been prepared, a die bonding step is carried out, the connections of the leadframe placed on a sheet for encapsulation are cut, electrical connection is provided, and then plastic encapsulation is carried out with the encapsulation sheet affixed to the leadframe.

Thus, even if no suspension leads are provided, the electrical connection and plastic encapsulation can be provided while the positions of the die pad and the land portions are stabilized, thereby obtaining the plastic-encapsulated semiconductor device in which the external terminals are provided at a high density.

In a second inventive method for fabricating a plastic-encapsulated semiconductor device, after the second inventive leadframe has been prepared, a die bonding step is carried out, the connections of the leadframe placed on a sheet for encapsulation are cut, electrical connection is provided, and then plastic encapsulation is carried out with the encapsulation sheet affixed to the leadframe.

Thus, the electrical connection and plastic encapsulation can be provided while the positions of the die pad and the land portions are stabilized, and the heat dissipating terminals and external terminals can be aligned together so as to be protruded from the bottom surface of the plastic encapsulant, thereby obtaining the plastic-encapsulated semiconductor device that can be easily packaged on a motherboard.

In the first inventive leadframe, the plastic-encapsulated semiconductor device formed using the leadframe, and the method for fabricating the semiconductor device, no suspension leads are provided, and thus the external terminals can be provided at a high density accordingly in the resulting plastic-encapsulated semiconductor device.

In the second inventive leadframe, the plastic-encapsulated semiconductor device formed using the leadframe, and the method for fabricating the semiconductor device, the die pad is provided with the heat dissipating terminals that are arranged along with the external terminals, and thus the packaging can be more easily carried out.

BRIEF DESCRIPTION OF THE DRAWINGS

FIG. 5 is a partial cross-sectional view illustrating the step of carrying out plastic encapsulation which is included in the fabrication process of the plastic-encapsulated semiconductor device of the first embodiment.

DESCRIPTION OF THE PREFERRED EMBODIMENTS

<First Embodiment>
Structure of Leadframe

Figure 1A:
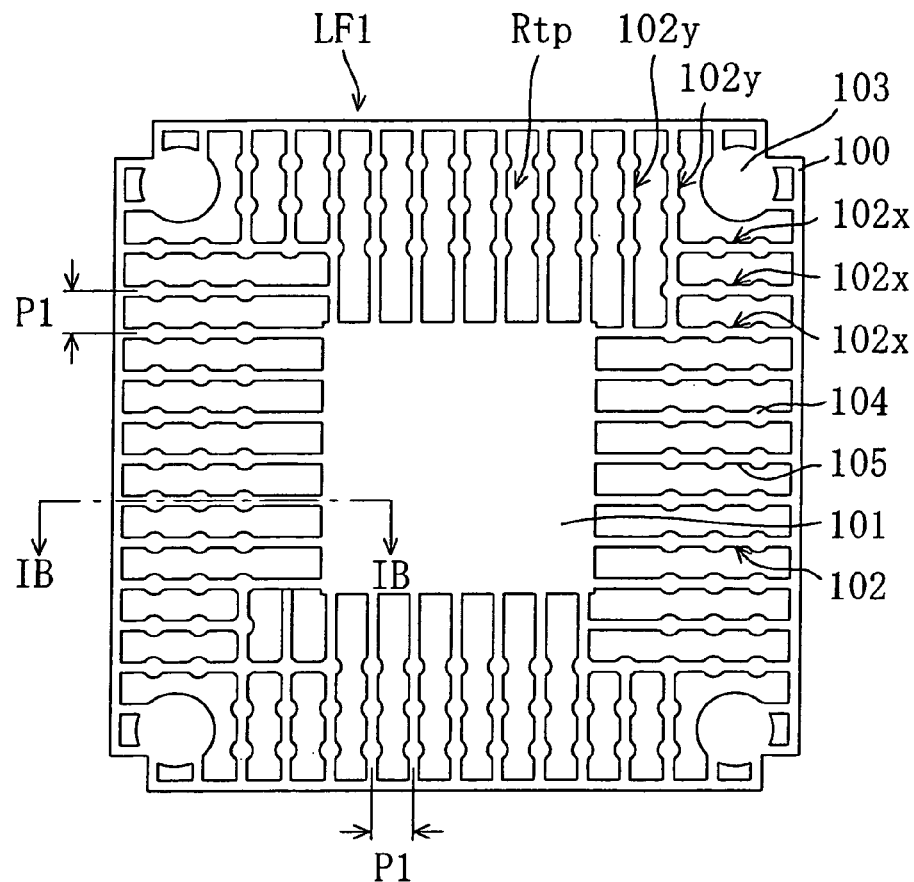
FIGS. 1A and 1B are a plan view of a leadframe according to a first embodiment of the present invention, and a cross-sectional view taken along the line IB—IB shown in FIG. 1A, respectively.
Figure 1B:
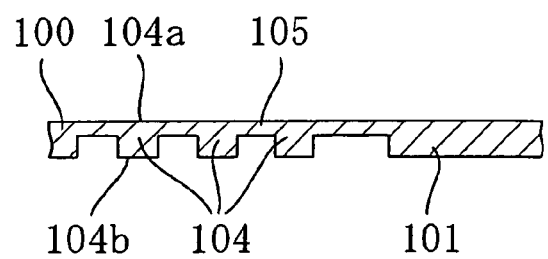

FIGS. 1A and 1B are a plan view of a leadframe (leadframe LF1) according to a first embodiment of the present invention, and a cross-sectional view taken along the line IB—IB shown in FIG. 1A, respectively. Actually, in the leadframe LF1, regions thereof on which a large number of semiconductor chips are to be mounted are laid out continuously in a grid pattern; however, FIG. 1A only shows a part of the leadframe LF1, i.e., a region thereof on which a single semiconductor chip is to be mounted. The leadframe LF1 is obtained by, for example, etching or stamping a copper alloy plate.

As shown in FIGS. 1A and 1B, the leadframe LF1 according to the present embodiment includes: a rectangular outer frame 100 including four sides that surround a region of the leadframe LF1 on which a semiconductor chip is to be mounted (which region will be hereinafter called a "chip mounting region Rtp"); a die pad 101 which is provided at the center of the chip mounting region Rtp and on which a semiconductor chip is to be mounted; leads 102 each extending from the outer frame 100 to connect with the die pad 101; and reinforcing lands 103.

The leads 102 of the present embodiment each include land portions 104 and connections 105 which are alternately arranged. The land portions 104 each have a width of 20 μm to 120 μm, for example, and a thickness of 20 μm to 120 μm, for example, and the connections 105 each have a width of 15 μm to 100 μm, for example, and a thickness of 15 μm to 100 μm, for example. That is, each land portion 104 is wider and thicker than each connection 105. The upper surface of each land portion 104 functions as a bonding pad 104a to be connected with a metal wiring. In the step of packaging a semiconductor chip on the leadframe LF1, plastic encapsulation is carried out with the lower surface of each land portion 104 fixed onto a sheet for encapsulation which has an adhesive layer, and after the plastic encapsulation has been completed, the lowermost part of each land portion 104 is allowed to function as a land electrode 104b (external terminal) that is protruded downward from the bottom surface of the plastic encapsulant. Via the connections 105, the outer frame 100 and the land portions 104 are connected to each other, the land portions 104 associated with each other in each lead 102 are connected to each other, and the land portions 104 and the die pad 101 are connected to each other. Each connection 105 is allowed to be devoid of its lower part by a pressing process utilizing a die or by an etching process, and is embedded within the plastic encapsulant in the step of packaging a semiconductor chip on the leadframe LF1. The connection 105 are each continuous with the upper part of each land portion 104, and the upper surface of each connection 105 and that of each land portion 104 constitute a common plane.

The features of the leadframe LF1 according to the present embodiment will be described below. In the leadframe LF1 of the present embodiment, there exists no member that has been provided in a normal leadframe and that merely functions as a suspension lead. In other words, every lead is provided with the land portion 104 in the present embodiment. Therefore, the die pad of the leadframe LF1 of the present embodiment is not connected to the outer frame during the step of carrying out plastic encapsulation, and there is provided no lead that functions as a suspension lead during this step. That is, in the plastic-encapsulated semiconductor device formed using the lead frame LF1, there exists no lead that is extended from the die pad 101 and is exposed at the surface of the plastic encapsulant.

In the leadframe LF1 of the present embodiment, the land portions 104 (i.e., the bonding pads 104a and land electrodes 104b) are also provided on lines that connect the corners of the die pad 101 and outer frame 100 together. Further, in the leadframe LF1 of the present embodiment, there exist leads 102x (or 102y) each having one end that is connected to one side of the outer frame 100 and the other end that is connected, in the vicinity of the associated corner, to other lead 102y (or 102x) extending from the other side of the outer frame 100 adjacent to the one side thereof In other words, there exist the leads 102x (or 102y) that are connected to the die pad 101 via the other leads 102y (or 102x). Furthermore, the leadframe LF1 of the present embodiment is provided with the reinforcing lands 103 each directly connected to the outer fame 100 in the vicinity of the corner thereof and having an area (e.g., a diameter of 300 µm to 1500 µm) considerably larger than that of each land portion 104.

The land electrodes (external terminals) 104b, which are the lowermost parts of the land portions 104, are substantially identical in shape in plan view, and are arranged in a lattice pattern. In this case, "substantially identical" means that they are identical when variations caused during fabrication are not taken into consideration.

In the leadframe LF1 of the present embodiment, in the vicinities of the corners of the die pad 101 and outer frame 100, no suspension leads are provided but the leads extending from adjacent two sides of the outer frame 100 are connected to each other, thus making it possible to form a plastic-encapsulated semiconductor device in which a plurality of rows of the land electrodes 104b (external terminals) are provided along each side of the outer frame 100 including the vicinities of the corners of the die pad 101. If suspension leads exist in the corners of the die pad and outer frame as in the conventional leadframe, a land electrode can be provided in a part of each suspension lead. In that case, however, each suspension lead is connected to the die pad, and therefore, the land electrode provided in a part of each suspension lead is only used as a simple reinforcing one or as a terminal (e.g., a ground terminal) whose potential is equal to that of the die pad. On the other hand, in the leadframe LF1 of the present embodiment, the land electrodes each functioning as a signal terminal can also be provided in the vicinity of each corner of the die pad 101, and thus the land electrodes can be provided at a high density. In other words, restrictions on the location and the number of the land electrodes can be relaxed.

Further, as will be described later, in the step of carrying out plastic encapsulation using the leadframe LF1 of the present embodiment, each land electrode 104b (land portion 104) and the die pad 101 are spaced apart and disconnected from each other, and are supported on a sheet for encapsulation in this state. Thus, it becomes possible to disperse the warping of the semiconductor device, which occurs due to a difference between the thermal contraction coefficient of the leadframe main body and that of the plastic encapsulant, and therefore, the amount of warping of the overall semiconductor device can be reduced.

In the leadframe LF1 of the present embodiment, the reinforcing lands 103, each having a large circular pattern, are provided in the corners of the outer frame 100. Therefore, when the plastic-encapsulated semiconductor device is packaged on a motherboard (i.e., when a secondary packaging is carried out), the strength of the connection between the plastic-encapsulated semiconductor device and the motherboard, which is provided by solder or the like, can be increased.

However, the reinforcing lands 103 do not necessarily have to be provided in the leadframe LF1 of the present embodiment. If the reinforcing lands 103 do not exist, the land electrodes (land portions) can be provided in the space made available by providing no reinforcing lands 103, and thus the land electrodes can be provided at a higher density.

Fabrication Process of Plastic-Encapsulated Semiconductor Device

Figure 2A:
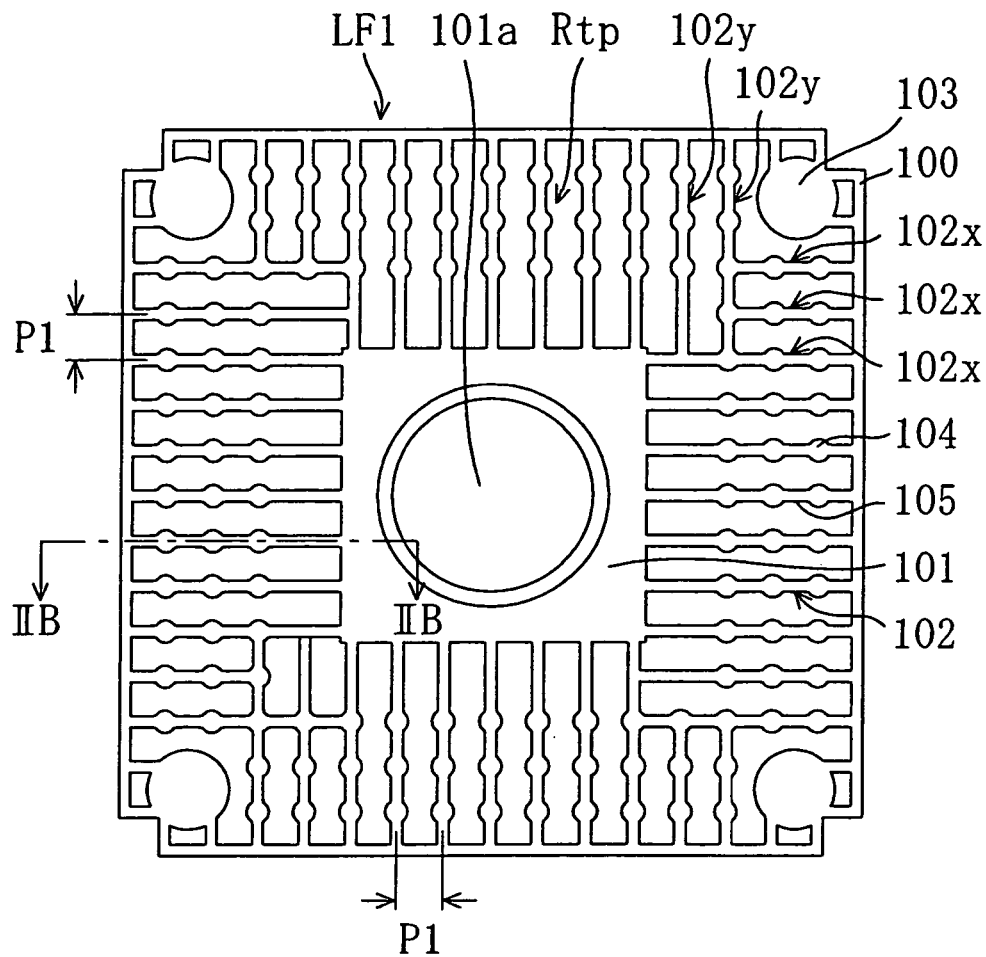
FIGS. 2A and 2B are a plan view illustrating the step of upsetting the center of a die pad which is included in the fabrication process of a plastic-encapsulated semiconductor device of the first embodiment, and a cross-sectional view taken along the line IIB—IIB shown in FIG. 2A, respectively.
Figure 2B:
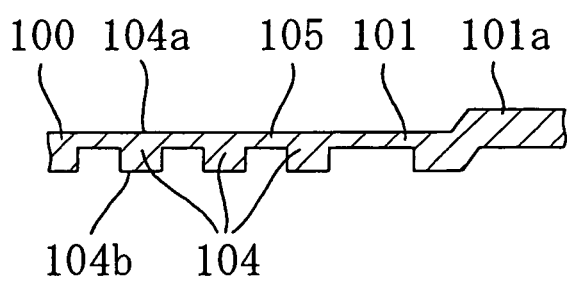
Figure 3A:
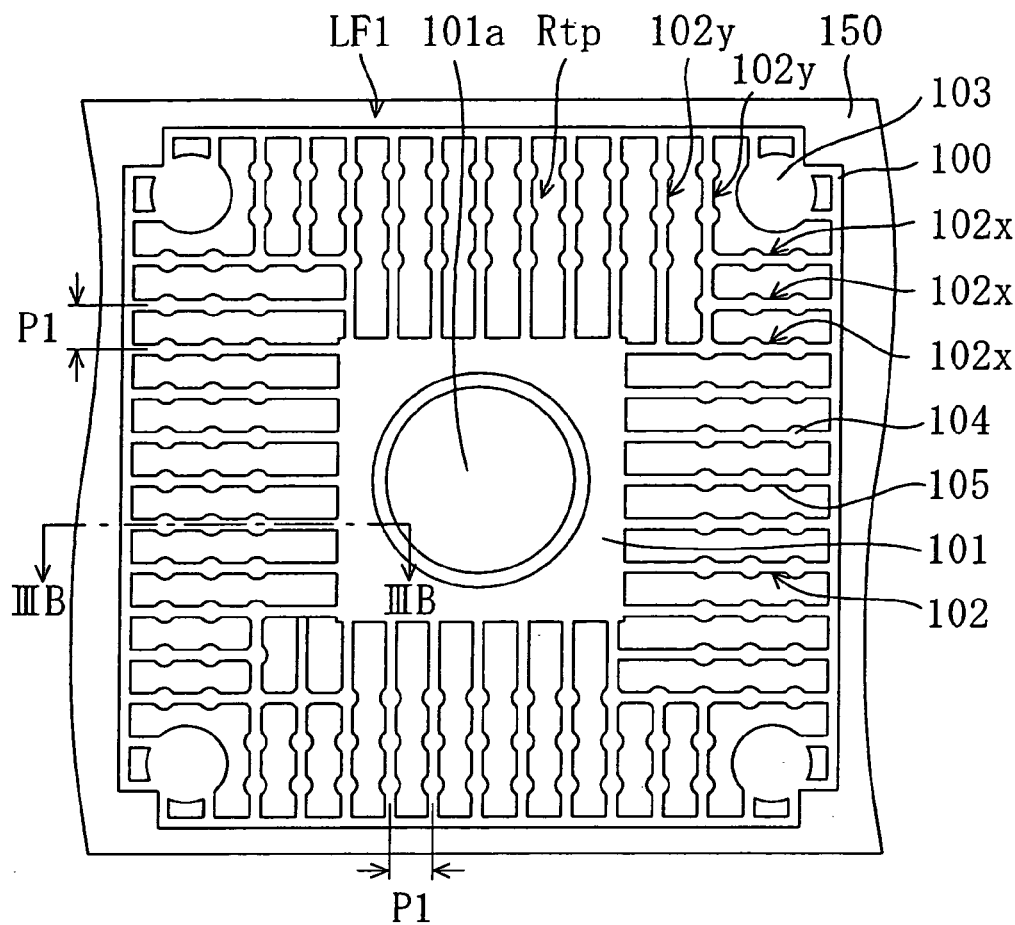
FIGS. 3A and 3B are a plan view illustrating the step of placing the leadframe on a sheet for encapsulation which is included in the fabrication process of the plastic-encapsulated semiconductor device of the first embodiment, and a cross-sectional view taken along the line IIIB—IIIB shown in FIG. 3A, respectively.
Figure 3B:
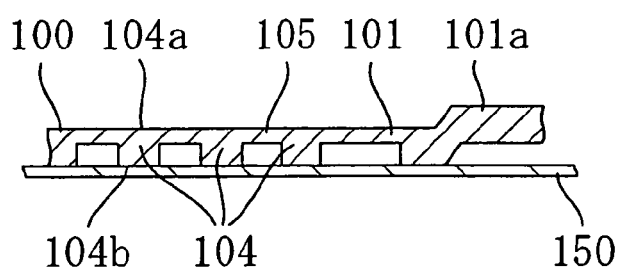
Figure 4A:
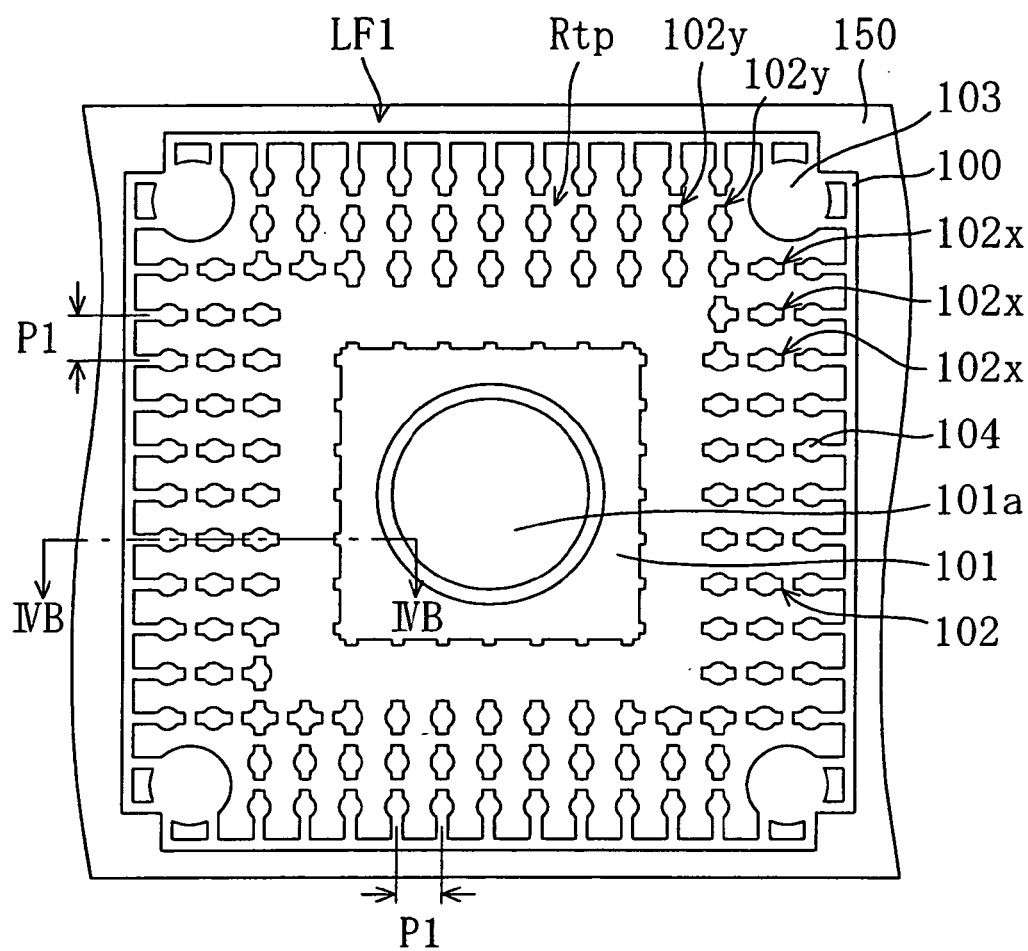
FIGS. 4A and 4B are a plan view illustrating the step of dividing leads which is included in the fabrication process of the plastic-encapsulated semiconductor device of the first embodiment, and a cross-sectional view taken along the line IVB—IVB shown in FIG. 4A, respectively.
Figure 4B:
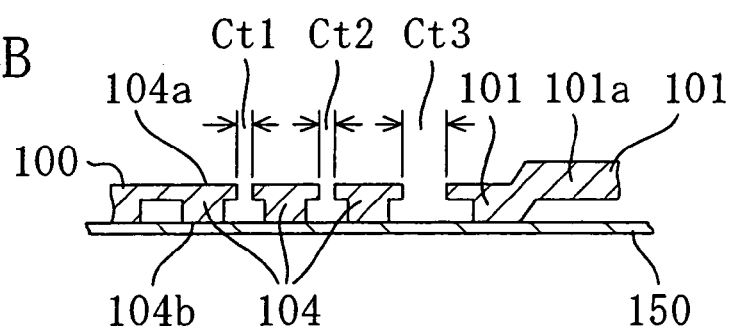
Figure 6A:
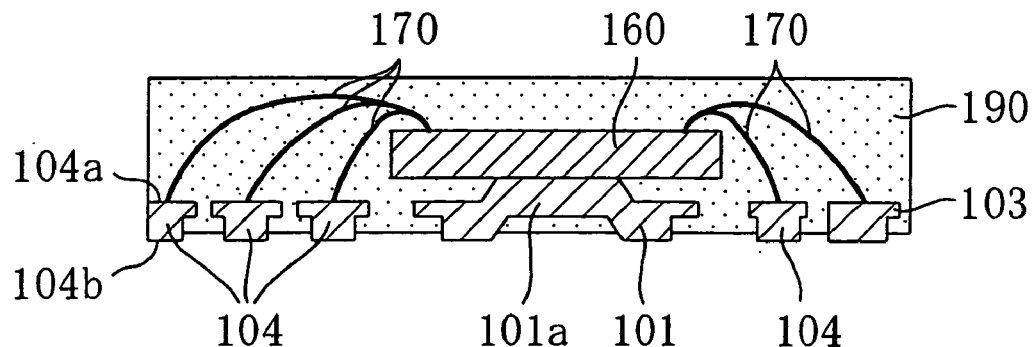
FIGS. 6A and 6B are a cross-sectional view, which is taken along the line VIA—VIA, for illustrating the structure of the plastic-encapsulated semiconductor device of the first embodiment after the plastic encapsulation step has been completed, and a bottom view of the semiconductor device, respectively.
Figure 6B:
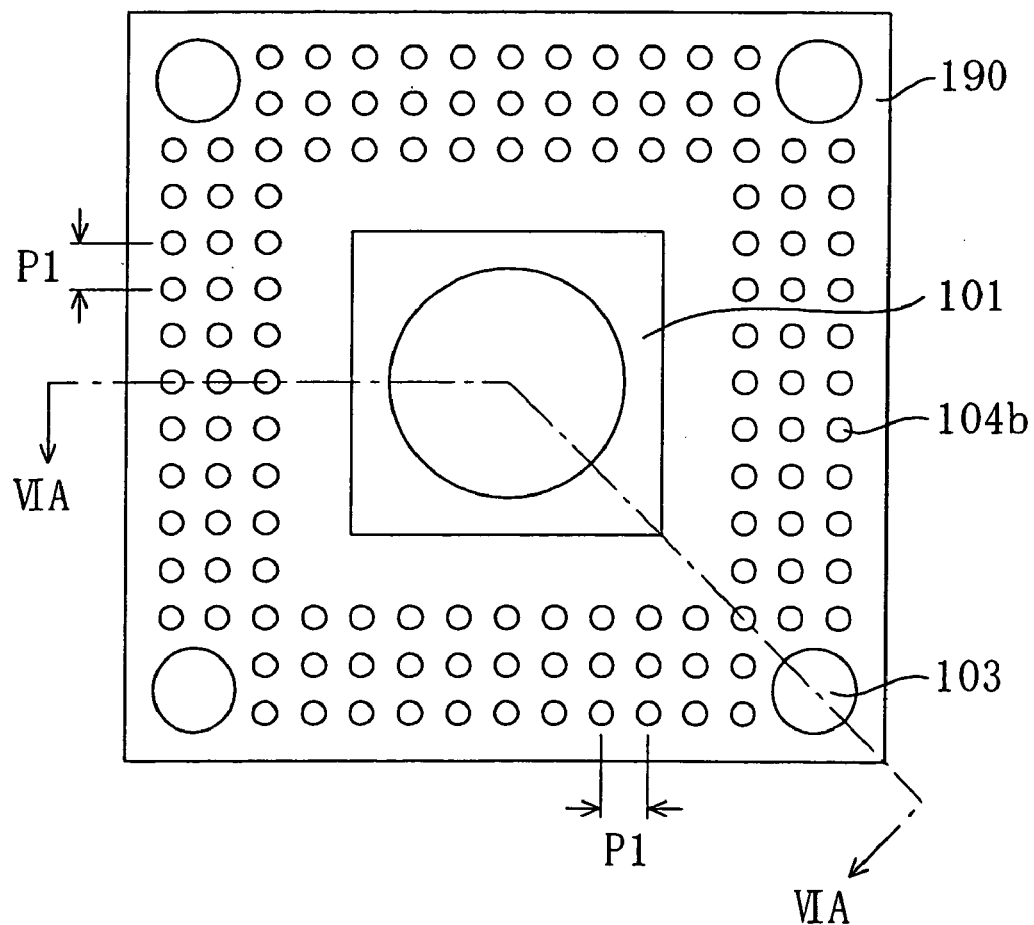

Described below is an exemplary fabrication process of a plastic-encapsulated semiconductor device in which the leadframe LF1 of the present embodiment is used. FIGS. 2A and 2B are a plan view illustrating the step of upsetting the center of the die pad which is included in the fabrication process of the plastic-encapsulated semiconductor device of the first embodiment, and a cross-sectional view taken along the line IIB—IIB shown in FIG. 2A, respectively. FIGS. 3A and 3B are a plan view illustrating the step of placing the leadframe on a sheet for encapsulation which is included in the fabrication process of the plastic-encapsulated semiconductor device of the first embodiment, and a cross-sectional view taken along the line IIIB—IIIB shown in FIG. 3A, respectively. FIGS. 4A and 4B are a plan view illustrating the step of dividing the leads which is included in the fabrication process of the plastic-encapsulated semiconductor device of the first embodiment, and a cross-sectional view taken along the line IVB—IVB shown in FIG. 4A, respectively. FIG. 5 is a partial cross-sectional view illustrating the step of carrying out plastic encapsulation which is included in the fabrication process of the plastic-encapsulated semiconductor device of the first embodiment. And FIGS. 6A and 6B are a cross-sectional view, which is taken along the line VIA—VIA, for illustrating the structure of the plastic-encapsulated semiconductor device of the first embodiment after the plastic encapsulation step has been completed, and a bottom view of the semiconductor device, respectively.

First, in the step shown in FIGS. 2A and 2B, a metal plate made of an alloy whose major constituent is copper (Cu) or made of an iron (Fe) and nickel (Ni) alloy is integrally molded by stamping or etching, and the leadframe LF1 having the structure shown in FIGS. 1A and 1B is prepared. Next, the leadframe LF1 is subjected to a pressing process by utilizing an upper die for half-shearing and a lower die for pressing (both the dies are not shown), thereby forming a circular protrusion 101a on the die pad 101. Although this step is carried out in order to upset a semiconductor chip and support it on the die pad 101, the protrusion 101a does not necessarily have to be provided. Furthermore, the leadframe LF1 is partially or entirely subjected to plating that is required for the connection of the leadframe LF1 with the semiconductor chip or the packaging thereof The leadframe LF1 may be given Ag plating, Au plating, Ni—Pd—Au plating or the like.

Next, in the step shown in FIGS. 3A and 3B, an encapsulation sheet 150 is affixed to the bottom surface of the leadframe LF1, i.e., the lower surfaces of the main body of the die pad 101, reinforcing lands 103 and land portions 104, so that the encapsulation sheet 150 is brought into intimate contact with these lower surfaces. Provided at the upper surface of the encapsulation sheet 150 is an adhesive layer, and via this adhesive layer, the die pad 101, the reinforcing lands 103 and the land portions 104 of the leads 102 are isolatedly fixed onto the encapsulation sheet 150.

Then, in the step shown in FIGS. 4A and 4B, the leads 102 are divided into cut portions Ct1, Ct2 and Ct3 by carrying out a pressing process using a die with the leadframe LF1 fixed on the encapsulation sheet 150. That is, the leads 102 are cut at the connections 105 between the land portions 104 and the die pad 101, at the connections 105 between the land portions 104 associated with each other in each lead 102, and at the connections between the land portions 104 and the outer frame 100, thus isolating the die pad 101 and each land portion 104.

Subsequently, although not shown, a die bonding step and a wire bonding step are carried out. In the die bonding step, a semiconductor chip 160 is mounted on the die pad 101 in each chip mounting region Rtp of the leadframe LF1 that is placed onto the encapsulation sheet 150, and in the wire bonding step, pad electrodes of the semiconductor chip 160 and the bonding pads 104a of the land portions 104 are connected to each other with metal wirings 170 each serving as a connecting member.

Then, as shown in FIG. 5, the leadframe LF1 is set in a die for encapsulation which includes an upper die member 180a and a lower die member 180b and has a die cavity therebetween. Specifically, the leadframe LF1 is set in the encapsulation die so that the semiconductor chip 160, the metal wirings 170 and so on are located within the die cavity, and the die cavity is filled with plastic encapsulant with the upper and lower die members 180a and 180b pressed towards each other.

After the plastic encapsulation step has been completed, the encapsulation sheet 150 is removed from the leadframe LF1 and the plastic encapsulant, and then a large number of plastic-encapsulated semiconductor devices provided on the leadframe LF1 are each cut out, thus obtaining the plastic-encapsulated semiconductor devices each having the structure shown in FIGS. 6A and 6B. It is to be noted that in the cross section shown in FIG. 6A, the transverse size of the right half is scaled down so as to correspond to that of the left half.

As shown in FIGS. 6A and 6B, each land electrode 104b, which is the lowermost part of each land portion 104 of the leadframe LF1, the lowermost part of the die pad 101 and the lowermost part of each reinforcing land 103 are protruded downward from plastic encapsulant 190. In particular, it can be seen that a plurality of rows of the land electrodes 104b are arranged at fixed pitch intervals (spacing) P1 in the longitudinal and transverse directions in FIG. 6B, and that the land electrodes 104b are arranged also in the vicinity of each corner. In the resulting plastic-encapsulated semiconductor device, there exists no lead that is extended from the die pad 101 and is exposed at the surface of the plastic encapsulant.

The spacing between the land electrodes 104b does not necessarily have to be fixed, and even if they are arranged at fixed pitch intervals, the pitch between the land electrodes 104b in the longitudinal direction in FIG. 6B may be different from the pitch between the land electrodes 104b in the transverse direction in FIG. 6B. However, if the land electrodes 104b are arranged at fixed pitch intervals in this way, the plastic-encapsulated semiconductor device compliant with the standards of the actual semiconductor device can be obtained.

In the plastic-encapsulated semiconductor device of the present embodiment, there exist no suspension leads that have conventionally been provided, and furthermore, the connections 105, which are narrower and thinner than the land portions 104, are provided between the die pad 101 and the land portions 104 of the leads 102, between the land portions 104 associated with each other in each lead 102, and between the land portions 104 and the outer frame 100. Therefore, in the step shown in FIGS. 4A and 4B, the leads 102 can be easily cut between the land portions 104 associated with each other in each lead 102 and between the land portions 104 and the outer frame 100 with the semiconductor chip 160 mounted on the leadframe LF1, and the wire bonding step and/or the plastic encapsulation step can be carried out with no connecting members provided between the die pad 101 and the outer frame 100.

Accordingly, the fabricators can be saved from having to carry out etching, stamping or the like for the formation of the suspension leads, and it becomes possible to obtain the plastic-encapsulated semiconductor device in which the land electrodes 104b are provided at a high density as shown in FIGS. 6A and 6B.

<Second Embodiment>

Figure 7A:
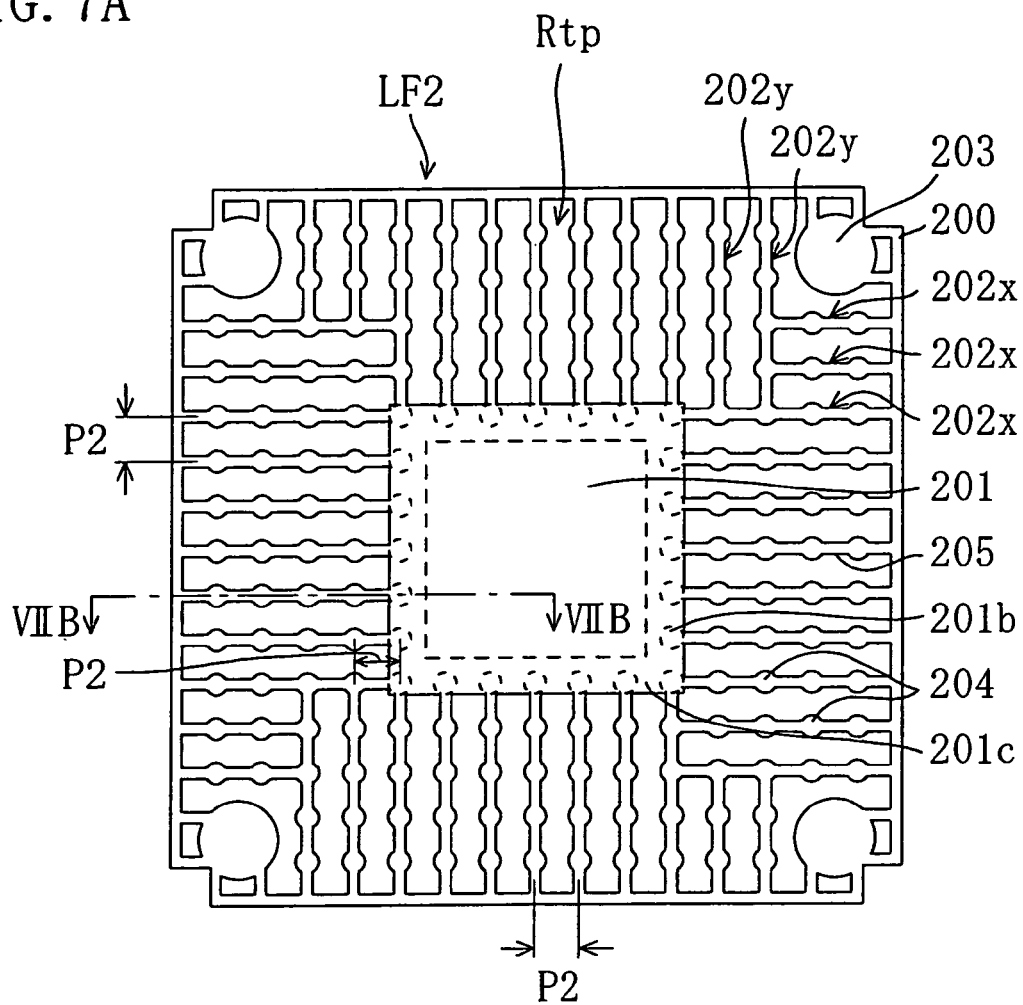
FIGS. 7A and 7B are a plan view of a leadframe according to a second embodiment of the present invention, and a cross-sectional view taken along the line VIIB—VIIB shown in FIG. 7A, respectively.
Figure 7B:
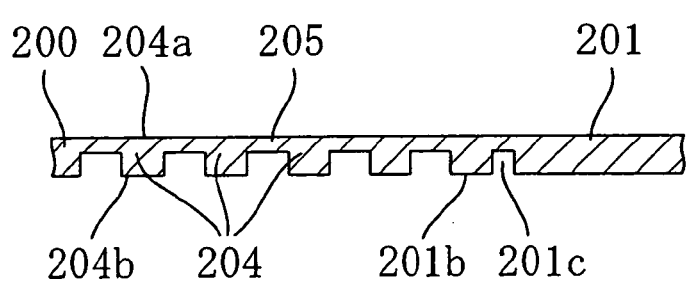

FIGS. 7A and 7B are a plan view of a leadframe (leadframe LF2) according to a second embodiment of the present invention, and a cross-sectional view taken along the line VIIB—VIIB shown in FIG. 7A, respectively. Actually, in the leadframe LF2, regions thereof on which a large number of semiconductor chips are to be mounted are laid out continuously in a grid pattern; however, FIG. 7A only shows a part of the leadframe LF2, i.e., a region thereof on which a single semiconductor chip is to be mounted. The leadframe LF2 is obtained by, for example, etching or stamping a copper alloy plate.

As shown in FIGS. 7A and 7B, the leadframe LF2 according to the present embodiment includes: a rectangular outer frame 200 including four sides that surround a chip mounting region Rtp; a die pad 201 which is provided at the center of the chip mounting region Rtp and on which a semiconductor chip is to be mounted; leads 202 each extending from the outer frame 200 to connect with the die pad 201; reinforcing lands 203; and heat dissipating terminals 201b that are provided at the peripheral section of the die pad 201 and are connected to the leads 202.

The leads 202 of the present embodiment each include land portions 204 and connections 205 which are alternately arranged. The land portions 204 each have a width of 20 μm to 120 μm, for example, and a thickness of 20 μm to 120 μm, for example, and the connections 205 each have a width of 15 μm to 100 μm, for example, and a thickness of 15 μm to 100 μm, for example. That is, each land portion 204 is wider and thicker than each connection 205. The upper surface of each land portion 204 functions as a bonding pad 204a to be connected with a metal wiring. In the step of packaging a semiconductor chip on the leadframe LF2, plastic encapsulation is carried out with the lower surface of each land portion 204 fixed onto an encapsulation sheet that has an adhesive layer, and after the plastic encapsulation has been completed, the lowermost part of each land portion 204 is allowed to function as a land electrode 204b that is protruded downward from the bottom surface of the plastic encapsulant. Via the connections 205, the outer frame 200 and the land portions 204 are connected to each other, the land portions 204 associated with each other in each lead 202 are connected to each other, and the land portions 204 and the heat dissipating terminals 201b of the die pad 201 are connected to each other. Each connection 205 is allowed to be devoid of its lower part by a pressing process utilizing a die or by an etching process, and is embedded within the plastic encapsulant in the step of packaging a semiconductor chip on the leadframe LF2. The connections 205 are each continuous with the upper part of each land portion 204, and the upper surface of each connection 205 and that of each land portion 204 constitute a common plane.

The features of the leadframe LF2 according to the present embodiment will be described below. In the leadframe LF2 of the present embodiment, there exists no suspension lead that has been provided in a normal leadframe and that only has the function of supporting the die pad. Furthermore, since the leads 202, through which the die pad 201 of the leadframe LF2 of the present embodiment is connected to the outer frame 200, are divided, the die pad 201 is disconnected from the outer frame 200 during the step of carrying out plastic encapsulation, and there is provided no lead that functions as a suspension lead during this step. In the leadframe LF2 of the present embodiment, the land portions 204 (i.e., the bonding pads 204a and land electrodes 204b) are also provided on lines that connect the corners of the die pad 201 and outer frame 200 together. Besides, in the leadframe LF2 of the present embodiment, there exist leads 202x (or 202y) each having one end that is connected to one side of the outer frame 200 and the other end that is not directly connected to the die pad 201 but connected, in the vicinity of the associated corner, to other lead 202y (or 202x) extending from the other side of the outer frame 200 adjacent to the one side thereof. In other words, there exist the leads 202x (or 202y) that extend from one side of the outer frame 200 and that are connected to the die pad 201 via the other leads 202y (or 202x) extending from the other side of the outer frame 200 adjacent to the one side thereof. Furthermore, in the vicinities of the corners of the outer frame 200, the leadframe LF2 of the present embodiment is provided with the reinforcing lands 203 each having an area (e.g., a diameter of 300 µm to 1500 µm) considerably larger than that of each land portion 204.

In addition to the features of the leadframe LF1 of the first embodiment, the leadframe LF2 of the second embodiment further has the following feature. The peripheral section of the die pad 201 is devoid of its lower part so as to form a thin portion 201c, and the heat dissipating terminals 201b are provided at the thin portion 201c so as to protrude downward from the lower surface thereof. The heat dissipating terminals 201b are each formed into such a shape by carrying out a half-etching or pressing process so that the peripheral section of the die pad 201 is devoid of its lower part while portions thereof to be used as the heat dissipating terminals 201b are left.

In the present embodiment, the land electrodes (external terminals) 204b, which are the lowermost parts of the land portions 204, and the lowermost parts of the heat dissipating terminals 201b are substantially identical in shape in plan view, and are arranged in a lattice pattern. In this case, "substantially identical" means that they are identical when variations caused during fabrication are not taken into consideration. However, the land electrodes (external terminals) 204b, i.e., the lowermost parts of the land portions 204, and the lowermost parts of the heat dissipating terminals 201b do not necessarily have to be substantially identical in shape in plan view. Even if these lowermost parts are not substantially identical in shape in plan view, the after-mentioned basic effects can be achieved.

Since the heat dissipating terminals 201b are provided, the leadframe LF2 of the present embodiment can achieve, in addition to the effects of the first embodiment, the following exceptional effects.

Suppose that a plastic-encapsulated semiconductor device with a Land Grid Array (LGA) structure is fabricated using the leadframe LF1 of the first embodiment. In that case, when the leads 102 are cut between the land portions 104 and the die pad 101 by a stamping process, the leads 102 might be deformed after they have been cut. Therefore, to avoid such a problem, it is required that the connections 105 between the land portions 104 and the die pad 101 be longer than the connections 105 between the land portions 104 associated with each other in each lead 102, as shown in FIGS. 1A and 1B. However, in the future, as the number of the land electrodes will be increased, the shape of the leads after stamping is expected to increase in complexity, which will be more likely to cause deformation and might reduce productivity.

If the die pad 201 is provided with the heat dissipating terminals 201b as in the second embodiment, the land portions 204 and die pad 201 can be smoothly detached from the outer frame 200 while the deformation of the leads 202 is being suppressed in the after-mentioned step of cutting the leads 202. As a result, the connections 205 for connecting the land portions 204 at the extreme ends of the leads 202 to the heat dissipating terminals 201b can be reduced in length, and thus the land portions 204 (and the land electrodes 204b) can be provided at a higher density.

Due to the existence of the heat dissipating terminals 201b, when the after-mentioned plastic-encapsulated semiconductor device is packaged on a motherboard, only the heat dissipating terminals 201b and land electrodes 204b can be connected to, for example, electrodes of the motherboard by a mass reflow soldering process without connecting the main body of the die pad 201, which is likely to cause connection failure, to the motherboard. Even if the main body of the die pad 201 is not connected to the motherboard, the heat generated in the semiconductor chip is allowed to quickly dissipate to the motherboard through the heat dissipating terminals 201b. The present embodiment is provided in view of the fact that heat dissipating function is saturated if the area of heat dissipation exceeds a certain level, and therefore, the total area of the lower surfaces of the plurality of heat dissipating terminals 201b is set so that the heat generated in the semiconductor chip is quickly dissipated to the motherboard and the function of each semiconductor element provided on the semiconductor chip is not degraded. Accordingly, the heat dissipating function of the plastic-encapsulated semiconductor device, in which the leadframe of the second embodiment is used, can be maintained at the substantially same level as that of the plastic-encapsulated semiconductor device of the first embodiment.

Fabrication Process of Plastic-Encapsulated Semiconductor Device

Figure 8A:
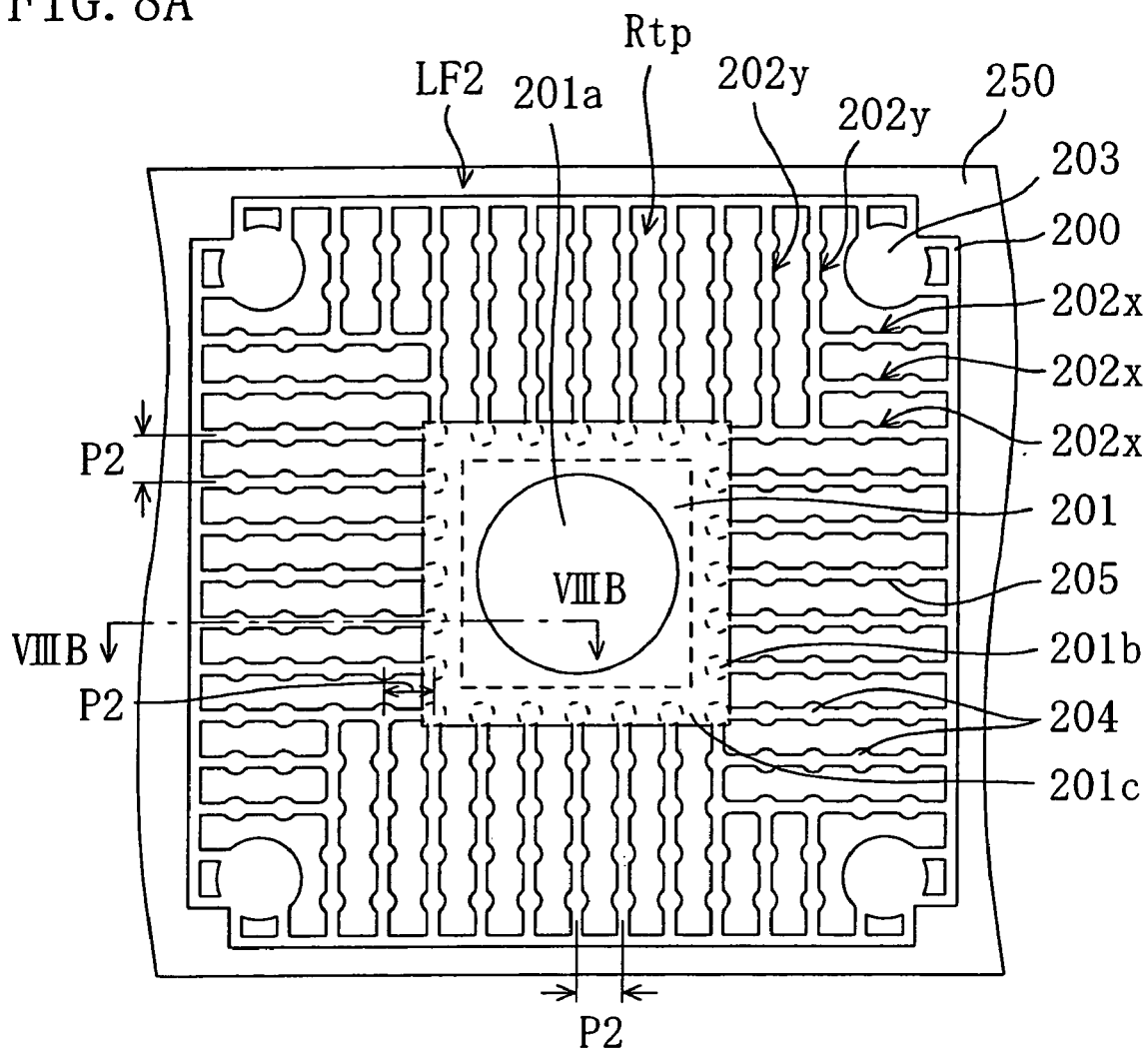
FIGS. 8A and 8B are a plan view illustrating the step of upsetting the center of a die pad and placing the leadframe on a sheet for encapsulation which is included in the fabrication process of the plastic-encapsulated semiconductor device of the second embodiment, and a cross-sectional view taken along the line VIIIB—VIIIB shown in FIG. 8A, respectively.
Figure 8B:
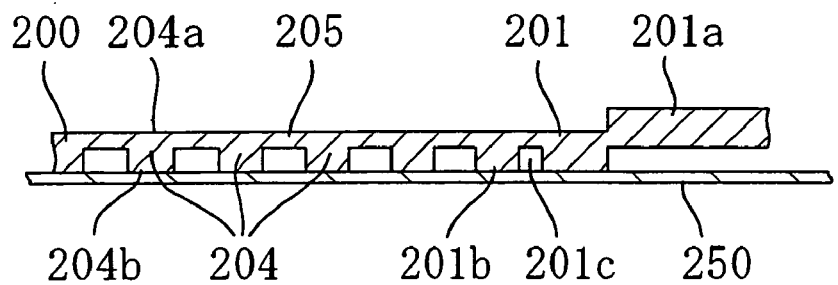
Figure 9A:
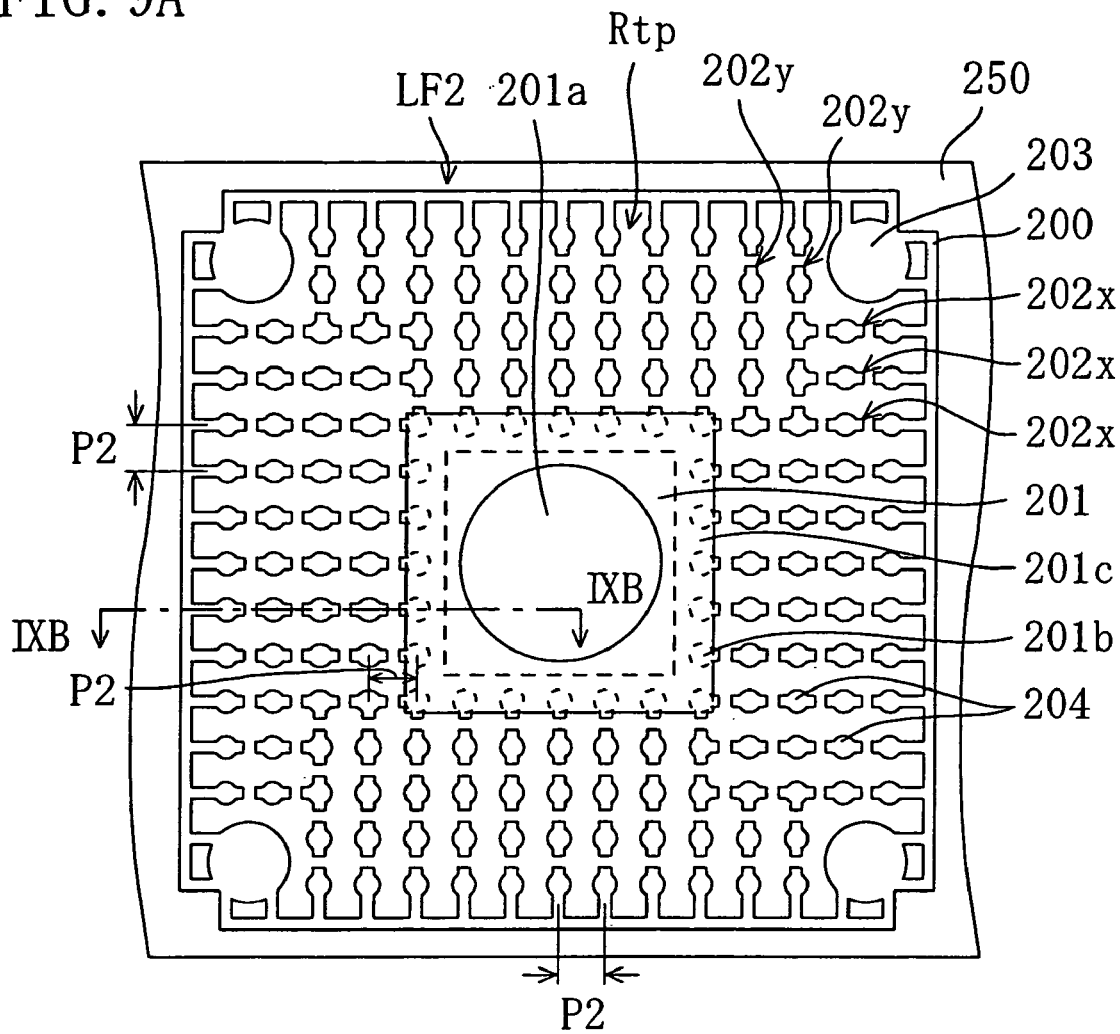
FIGS. 9A and 9B are a plan view illustrating the step of dividing leads which is included in the fabrication process of the plastic-encapsulated semiconductor device of the second embodiment, and a cross-sectional view taken along the line IXB—IXB shown in FIG. 9A, respectively.
Figure 9B:
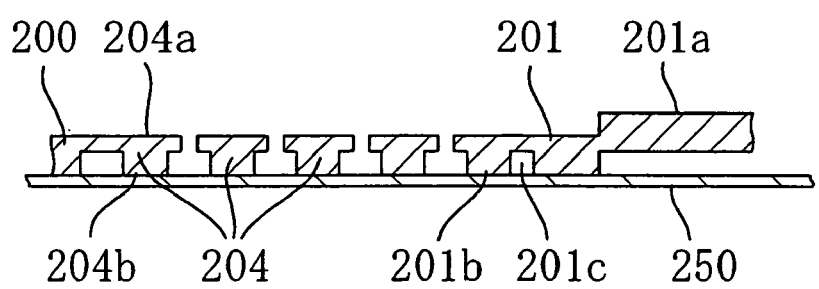
Figure 10A:
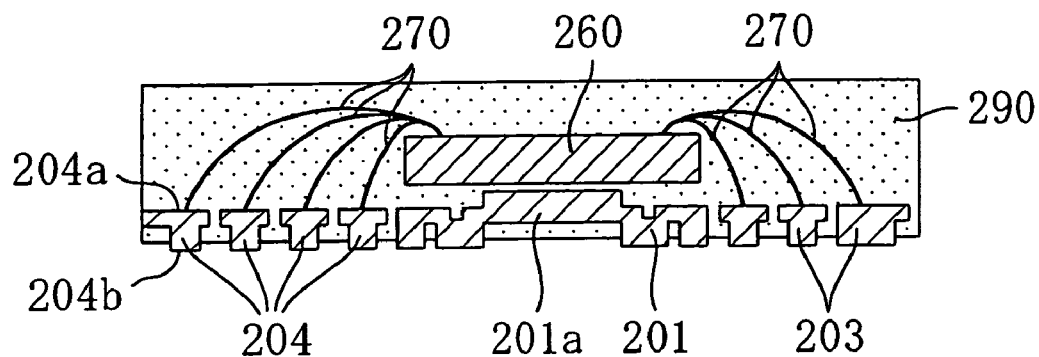
FIGS. 10A and 10B are a cross-sectional view, which is taken along the line XA—XA, for illustrating the structure of the plastic-encapsulated semiconductor device of the second embodiment after plastic encapsulation has been completed, and a bottom view of the semiconductor device, respectively.
Figure 10B:
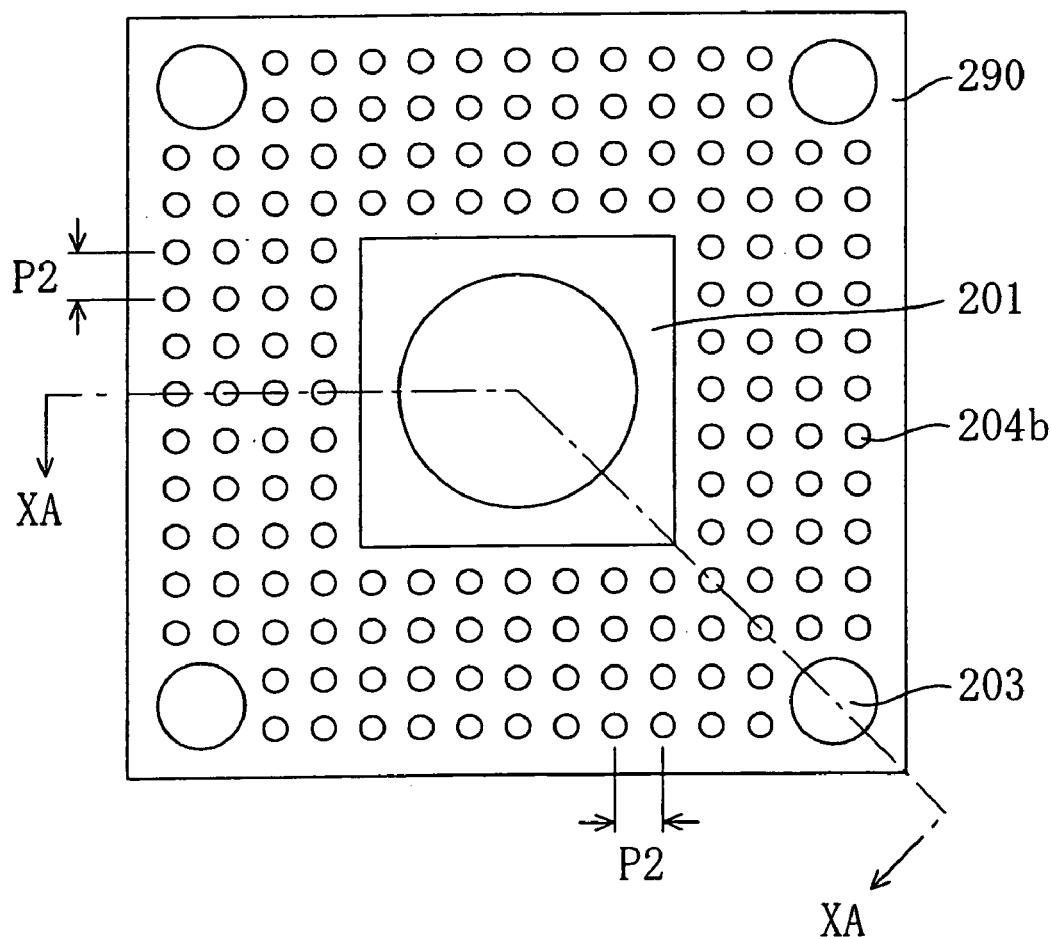

Described below is an exemplary fabrication process of a plastic-encapsulated semiconductor device in which the leadframe LF2 of the present embodiment is used. FIGS. 8A and 8B are a plan view illustrating the step of upsetting the center of the die pad and placing the leadframe on an encapsulation sheet which is included in the fabrication process of the plastic-encapsulated semiconductor device of the second embodiment, and a cross-sectional view taken along the line VIIIB—VIIIB shown in FIG. 8A, respectively. FIGS. 9A and 9B are a plan view illustrating the step of dividing the leads which is included in the fabrication process of the plastic-encapsulated semiconductor device of the second embodiment, and a cross-sectional view taken along the line IXB—IXB shown in FIG. 9A, respectively. And FIGS. 10A and 10B are a cross-sectional view, which is taken along the line XA—XA, for illustrating the structure of the plastic-encapsulated semiconductor device of the second embodiment after plastic encapsulation has been completed, and a bottom view of the semiconductor device, respectively.

First, in the step shown in FIGS. 8A and 8B, a metal plate made of an alloy whose major constituent is copper (Cu) or made of an iron (Fe) and nickel (Ni) alloy is integrally molded by stamping or etching, and the leadframe LF2 having the structure shown in FIGS. 7A and 7B is prepared. Next, the leadframe LF2 is subjected to a pressing process by utilizing an upper die for half-shearing and a lower die for pressing (both the dies are not shown), thereby forming a circular protrusion 201a on the die pad 201. Although this step is carried out in order to upset a semiconductor chip and support it on the die pad 201, the protrusion 201a does not necessarily have to be provided. Furthermore, the leadframe LF2 is partially or entirely subjected to plating that is required for the connection of the leadframe LF2 with the semiconductor chip or the packaging thereof. The leadframe LF2 may be given Ag plating, Au plating, Ni—Pd—Au plating or the like.

Next, an encapsulation sheet 250 is affixed to the bottom surface of the leadframe LF2, i.e., the lower surfaces of the die pad 201, reinforcing lands 203 and land portions 204, so that the encapsulation sheet 250 is brought into intimate contact with these lower surfaces. Provided at the upper surface of the encapsulation sheet 250 is an adhesive layer, and via this adhesive layer, the main body of the die pad 201, the heat dissipating terminals 201b of the die pad 201, the reinforcing lands 203 and the land portions 204 of the leads 202 are isolatedly fixed onto the encapsulation sheet 250.

Then, in the step shown in FIGS. 9A and 9B, the leads 202 are cut at the connections 205 by carrying out a pressing process using a die with the leadframe LF2 fixed onto the encapsulation sheet 250. In this step, the leads 202 are cut at the connections 205 between the land portions 204 of the leads 202 and the heat dissipating terminals 201b of the die pad 201, at the connections 205 between the land portions 204 associated with each other in each lead 202, and at the connections 205 between the land portions 204 and the outer frame 200 so that the die pad 201 and each land portion 204 are isolated. In this case, there exists no connecting member for connecting the die pad 201 to the outer frame 200.

Subsequently, although not shown, a die bonding step and a wire bonding step are carried out. In the die bonding step, a semiconductor chip 260 is mounted on the die pad 201 in each chip mounting region Rtp of the leadframe LF2 that is placed onto the encapsulation sheet 250, and in the wire bonding step, pad electrodes of the semiconductor chip 260 and the bonding pads 204a of the land portions 204 are connected to each other with metal wirings 270 each serving as a connecting member.

Then, as in the step shown in FIG. 5 in the first embodiment, the leadframe LF2 is set in an encapsulation die that includes an upper die member 180a and a lower die member 180b and has a die cavity therebetween. Specifically, the leadframe LF2 is set in the encapsulation die so that the semiconductor chip 260, the metal wirings 270 and so on are located within the die cavity, and the die cavity is filled with plastic encapsulant with the upper and lower die members 180a and 180b pressed toward each other.

After the step of carrying out plastic encapsulation has been completed, the encapsulation sheet 250 is removed from the leadframe LF2 and plastic encapsulant, and then a large number of plastic-encapsulated semiconductor devices provided on the leadframe LF2 are each cut out, thus obtaining the plastic-encapsulated semiconductor devices each having the structure shown in FIGS. 10A and 10B. It is to be noted that in the cross section shown in FIG. 10A, the transverse size of the right half is scaled down so as to correspond to that of the left half.

As shown in FIGS. 10A and 10B, each land electrode 204b, which is the lowermost part of each land portion 204 of the leadframe LF2, the lowermost part of the main body of the die pad 201, the lowermost part of each heat dissipating terminal 201b of the die pad 201, and the lowermost part of each reinforcing land 203 are protruded downward from plastic encapsulant 290. In particular, it can be seen that a plurality of rows (three or more rows) of the heat dissipating terminals 201b and land electrodes 204b are arranged at fixed pitch intervals (spacing) P2 in the longitudinal and transverse directions in FIG. 10B, and the heat dissipating terminals 201b and the land electrodes 204b are arranged also in the vicinity of each corner.

When the plastic-encapsulated semiconductor device is packaged on the motherboard afterward, it is sufficient to connect the land electrodes 204b and heat dissipating terminals 201b to the associated electrodes of the motherboard by a mass reflow soldering process, and in this case, it is unnecessary to connect the main body of the die pad 201 to the motherboard.

In the plastic-encapsulated semiconductor device of the present embodiment, there exist no suspension leads that have conventionally been provided, and furthermore, the connections 205, which are narrower and thinner than the land portions 204, are provided between the die pad 201 and the land portions 204 of the leads 202, between the land portions 204 associated with each other in each lead 202, and between the land portions 204 and the outer frame 200. Therefore, in the step shown in FIGS. 9A and 9B, the leads 202 can be easily cut between the land portions 204 associated with each other in each lead 202 and between the land portions 204 and the outer frame 200 with the semiconductor chip 260 mounted on the leadframe LF2, and the wire bonding step and/or the plastic encapsulation step can be carried out with no connecting member provided between the die pad 201 and the outer frame 200.

Accordingly, the fabricators can be saved from having to carry out etching, stamping or the like for the formation of the suspension leads, and since the heat dissipating terminals 201b are provided as already described above, the land electrodes 204b can be provided at a density higher than that at which the land electrodes 104a are provided in the first embodiment.

Besides, since the die pad 201 is provided with the heat dissipating terminals 201b, the heat dissipating terminals 201b and land electrodes 204b can be connected to, for example, the electrodes of the motherboard by a mass reflow soldering process in the step of packaging the plastic-encapsulated semiconductor device. That is, when the plastic-encapsulated semiconductor device is packaged, it is unnecessary to connect the main body of the die pad 201 to the motherboard for heat dissipation; therefore, the occurrence of connection failure can be reduced, and the packaging can be easily completed while the heat dissipating property of the plastic-encapsulated semiconductor device is being maintained at a high level.

The spacing between the heat dissipating terminals 201b and the land electrodes 204b, and the spacing between the land electrodes 204b do not necessarily have to be fixed, and even if they are arranged at fixed pitch intervals, the pitch in the longitudinal direction in FIG. 10B may be different from the pitch in the transverse direction in FIG. 10B. However, it is particularly preferable that the heat dissipating terminals 201b and the land portions 204 are substantially identical in shape in plan view, and that the connections 205 between the heat dissipating terminals 201b and the land portions 204 and the connections 205 between the land portions 204 associated with each other in each lead 202 are substantially identical in shape in plan view. In such a case, since the heat dissipating terminals 201b and the land electrodes 204b are provided at fixed pitch intervals, the mass reflow soldering process can be easily carried out, thus easily carrying out the packaging of the plastic-encapsulated semiconductor device.

<Other Embodiments>

Figure 11A:
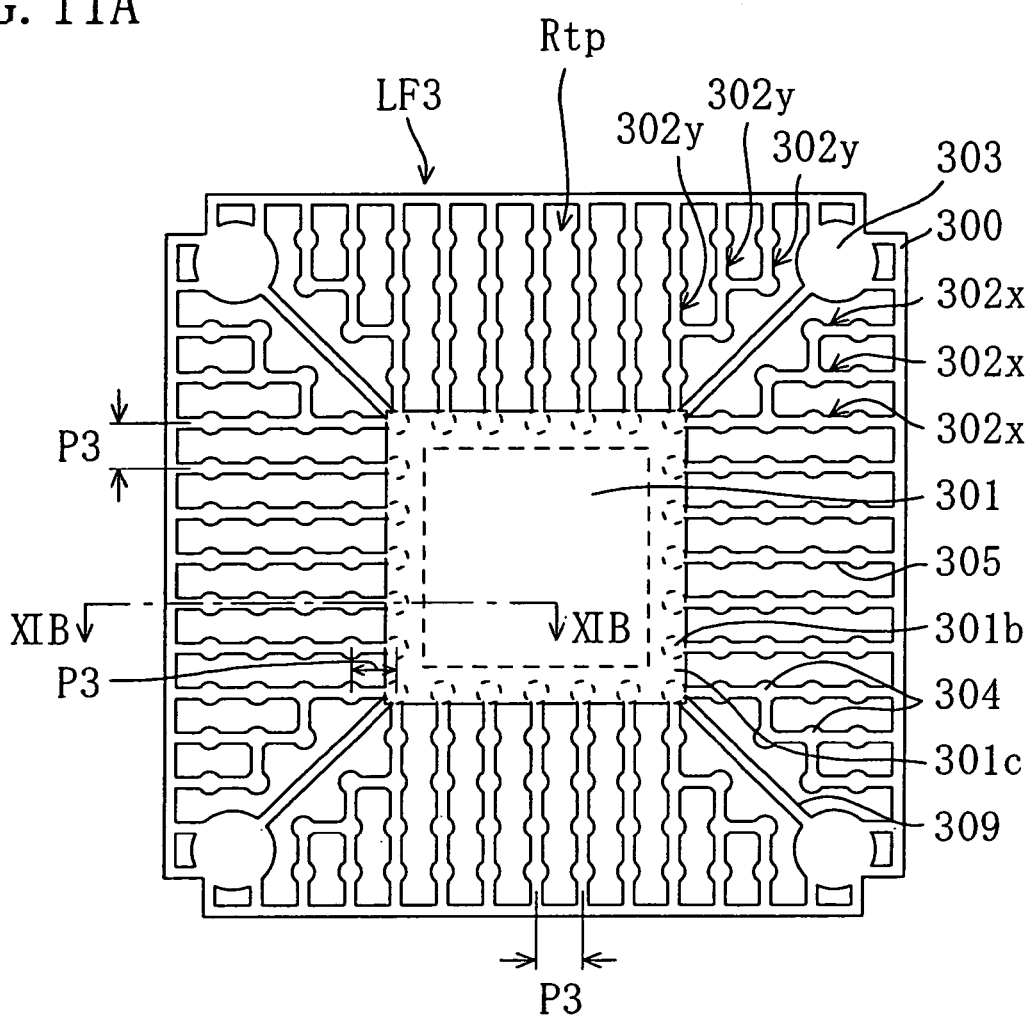
FIGS. 11A and 11B are a plan view of a leadframe according to a modified example of the second embodiment of the present invention, and a cross-sectional view taken along the line XIB—XIB shown in FIG. 11A, respectively.
Figure 11B:
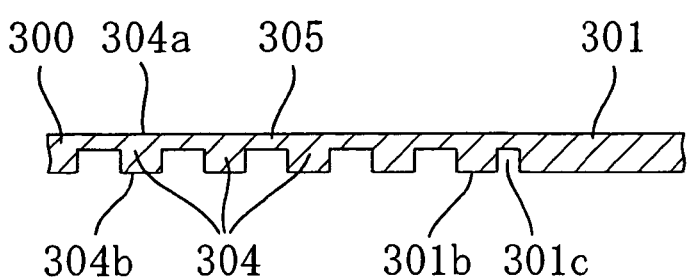
Figure 12:
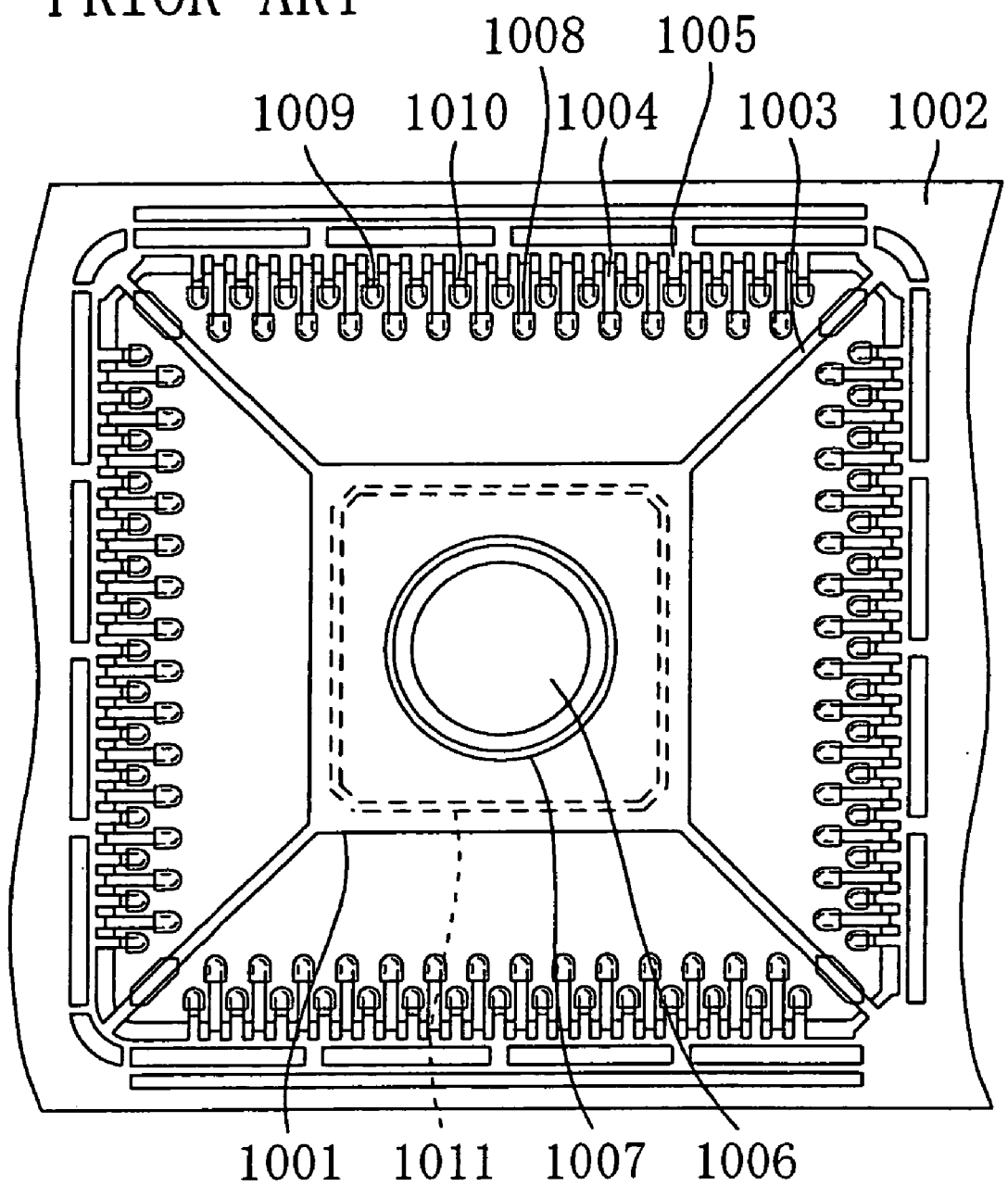
FIG. 12 shows the structure of a conventional leadframe used for a plastic-encapsulated semiconductor device.

FIGS. 11A and 11B are a plan view of a leadframe (leadframe LF3) according to a modified example of the second embodiment of the present invention, and a cross-sectional view taken along the line XIB—XIB shown in FIG. 11A, respectively. Actually, in the leadframe LF3, regions thereof on which a large number of semiconductor chips are to be mounted are laid out continuously in a grid pattern; however, FIG. 11A only shows a part of the leadframe LF3, i.e., a region thereof on which a single semiconductor chip is to be mounted. The leadframe LF3 is obtained by, for example, etching or stamping a copper alloy plate.

As shown in FIGS. 11A and 11B, the leadframe LF3 according to the modified example includes: a rectangular outer frame 300 including four sides that surround a chip mounting region Rtp; a die pad 301 which is provided at the center of the chip mounting region Rtp and on which a semiconductor chip is to be mounted; leads 302 extending from the outer frame 300 to connect with the die pad 301; reinforcing lands 303; and heat dissipating terminals 301b that are provided at the peripheral section of the die pad 301 and are connected to the lead 302.

The leads 302 of the modified example each include land portions 304 and connections 305 which are alternately arranged. The land portions 304 each have a width of 20 μm to 120 μm, for example, and a thickness of 20 μm to 120 μm, for example, and the connections 305 each have a width of 15 μm to 100 μm, for example, and a thickness of 15 μm to 100 μm, for example. That is, each land portion 304 is wider and thicker than each connection 305. The upper surface of each land portion 304 functions as a bonding pad 304a to be connected with a metal wiring. In the step of packaging a semiconductor chip on the leadframe LF3, plastic encapsulation is carried out with the lower surface of each land portion 304 fixed onto an encapsulation sheet having an adhesive layer, and after the plastic encapsulation has been completed, the lowermost part of each land portion 304 is allowed to function as a land electrode 304b that is protruded downward from the bottom surface of the plastic encapsulant. Via the connections 305, the outer frame 300 and the land portions 304 are connected to each other, the land portions 304 associated with each other in each lead 302 are connected to each other, and the land portions 304 and the heat dissipating terminals 301b of the die pad 301 are connected to each other. Each connection 305 is allowed to be devoid of its lower part by a pressing process utilizing a die or by an etching process, and is embedded within the plastic encapsulant in the step of packaging a semiconductor chip on the leadframe LF3. The connections 305 are each continuous with the upper part of each land portion 304, and the upper surface of each connection 305 and that of each land portion 304 constitute a common plane.

In the leadframe LF3 of the modified example, there exist leads each functioning as a suspension lead during the step of carrying out plastic encapsulation. To be more specific, in the leadframe LF3 of the modified example, unlike the leadframe LF2 of the second embodiment, there are provided suspension leads 309 that are directly connected to the die pad 301 in the vicinities of the corners thereof. Therefore, unlike the second embodiment, there exists no lead having one end connected to one side of the outer frame 300 and the other end connected to the other lead extending from the other side of the outer frame 300 adjacent to the one side thereof. In the leadframe LF3, each lead 302x (or 302y), provided in the vicinity of a corner of the outer frame 300 and connected to one side of the outer frame 300, is connected with another lead 302x (or 302y) extending from the one side of the outer frame 300.

Also in the leadframe LF3 of the modified example, in the vicinities of the corners of the outer frame 300, there are provided the reinforcing lands 303 each having an area (e.g., a diameter of 300 μm to 1500 μm) considerably larger than that of each land portion 304.

In the modified example, like the second embodiment, the heat dissipating property can be improved and the land electrodes 304b can be provided at a high density due to the existence of the heat dissipating terminals 301b. However, since the suspension leads 309 are provided in the modified example, the density at which the land electrodes 304b are provided in the modified example is lower than that at which the land electrodes 204b are provided in the second embodiment; on the other hand, the die pad 301 can be more stably held during the step of cutting the leads 302 in the modified example than in the second embodiment.

In the first embodiment, second embodiment and modified example thereof, the connections may be provided between the land portions of the adjacent leads. In such a case, the land portions are connected in a lattice pattern in both of the longitudinal and transverse directions, and therefore, the shape of the leadframe can be more stably kept until the leads are cut.

The inventive leadframe and plastic-encapsulated semiconductor device are applicable as electronic components to be provided in personal computers, household electrical appliances and communications equipment.

What is claimed is:

1. A method for fabricating a plastic-encapsulated semiconductor device, the method comprising the steps of:
   a) preparing a leadframe comprising an outer frame with a plurality of sides surrounding a region of the leadframe on which a semiconductor chip is to be mounted, a die pad on which the semiconductor chip is to be mounted, and a plurality of leads each having land portions and connections, the land portions each having an upper surface serving as a bonding pad to be connected with a metal wiring and a lowermost part serving as an external terminal, the connections each being devoid of its lower part so as to be thinner than the land portion and being provided between the outer frame and the land portions, between the land portions associated with each other in each lead and between the land portions and the die pad, wherein the plurality of leads include no member that functions as a suspension lead during plastic encapsulation;
   b) mounting the semiconductor chip on the die pad of the leadframe;
   c) placing the leadframe on an adhesive sheet for encapsulation;
   d) cutting the connections with the leadframe placed on the encapsulation sheet, thus detaching, from the outer frame, the isolated land portions and the die pad;
   e) connecting, through a connecting member, a portion of the semiconductor chip to the associated bonding pad; and
   f) carrying out plastic encapsulation with the leadframe placed on the encapsulation sheet, wherein the step c) is carried out prior to or subsequent to the step b), and the steps d), e) and f) are carried out in this order after the step c) has been carried out.

2. The method according to claim 1,
wherein after the step f) has been carried out, there exists no member that is connected to the die pad and that has its end exposed at a surface of the plastic encapsulant.

3. The method according to claim 1,
wherein the plurality of leads of the leadframe prepared in the step a) include a lead that is connected to one side of the outer frame and is connected to the other lead that is connected to the other side of the outer frame adjacent to the one side thereof.

4. A method for fabricating a plastic-encapsulated semiconductor device, the method comprising the steps of:

a) preparing a leadframe comprising an outer frame with a plurality of sides surrounding a region of the leadframe on which a semiconductor chip is to be mounted, a die pad having a thin portion that is provided along the peripheral section of the main body of the die pad and that is devoid of its lower part and having a plurality of heat dissipating terminals each protruded downward from the lower surface of the thin portion, and a plurality of leads each having land portions and connections, the land portions each having an upper surface serving as a bonding pad to be connected with a metal wiring and a lowermost part serving as an external terminal, the connections each being devoid of its lower part so as to be thinner than the land portion and being provided between the outer frame and the land portions, between the land portions associated with each other in each lead, and between the land portions and the heat dissipating terminals;

b) mounting the semiconductor chip on the die pad of the leadframe;

c) placing the leadframe on an adhesive sheet for encapsulation;

d) cutting the connections with the leadframe placed on the encapsulation sheet, thus detaching the isolated land portions from the outer frame;

e) connecting, through a connecting member, a portion of the semiconductor chip to the associated bonding pad; and f) carrying out plastic encapsulation with the leadframe placed on the encapsulation sheet, wherein the step c) is carried out prior to or subsequent to the step b), and the steps d), e) and f) are carried out in this order after the step c) has been carried out.

5. The method according to claim 4,
wherein in the step a), the leadframe prepared is provided with no member that functions as a suspension lead during the plastic encapsulation, and
wherein in the step d), the die pad is also detached from the outer frame.

6. The method according to claim 4,
wherein the plurality of leads of the leadframe prepared in the step a) include a lead that is connected to one side of the outer frame and is connected to the other lead that is connected to the other side of the outer frame adjacent to the one side thereof.

* * * * *